(12) United States Patent
Sato et al.

(10) Patent No.: US 8,299,366 B2
(45) Date of Patent: Oct. 30, 2012

(54) WIRING BOARD AND METHOD FOR MANUFACTURING THE SAME

(75) Inventors: Kenji Sato, Ogaki (JP); Shunsuke Sakai, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 265 days.

(21) Appl. No.: 12/566,731

(22) Filed: Sep. 25, 2009

(65) Prior Publication Data
US 2010/0300737 A1    Dec. 2, 2010

Related U.S. Application Data

(60) Provisional application No. 61/182,245, filed on May 29, 2009.

(51) Int. Cl.
*H05K 1/16* (2006.01)
(52) U.S. Cl. ........ 174/260; 174/256; 174/258; 174/261; 174/262; 361/728; 361/763; 361/764; 361/782; 361/787; 428/137; 428/210; 29/832
(58) Field of Classification Search .................. 174/260, 174/256, 258, 261, 262; 361/728, 763, 764, 361/782, 787; 428/137, 210; 257/774, 777; 29/832
See application file for complete search history.

(56) References Cited

U.S. PATENT DOCUMENTS

| | | | |
|---|---|---|---|
| 6,740,411 B2 * | 5/2004 | Kojima et al. | 428/413 |
| 6,809,268 B2 * | 10/2004 | Hayashi et al. | 174/260 |
| 6,876,091 B2 * | 4/2005 | Takeuchi et al. | 257/793 |
| 2002/0132096 A1 * | 9/2002 | Takeuchi et al. | 428/210 |
| 2002/0161100 A1 * | 10/2002 | Kojima et al. | 524/492 |
| 2002/0185303 A1 * | 12/2002 | Takeuchi et al. | 174/256 |
| 2005/0265671 A1 * | 12/2005 | Ono et al. | 385/92 |
| 2006/0012967 A1 * | 1/2006 | Asai et al. | 361/764 |
| 2006/0131740 A1 * | 6/2006 | Kawabata et al. | 257/723 |
| 2006/0291173 A1 * | 12/2006 | Cho et al. | 361/760 |
| 2007/0178279 A1 * | 8/2007 | Ogawa et al. | 428/137 |
| 2007/0263364 A1 * | 11/2007 | Kawabe et al. | 361/728 |
| 2007/0281394 A1 * | 12/2007 | Kawabe et al. | 438/118 |

(Continued)

FOREIGN PATENT DOCUMENTS

JP          2001-313467           11/2001
(Continued)

OTHER PUBLICATIONS

U.S. Appl. No. 12/555,438, filed Sep. 8, 2009, Sakai, et al.

*Primary Examiner* — Xiaoliang Chen
(74) *Attorney, Agent, or Firm* — Oblon, Spivak, McClelland, Maier & Neustadt, L.L.P.

(57) ABSTRACT

A wiring board is formed with a substrate designating either the upper surface or the lower surface as a first surface and the other as a second surface; an electronic component arranged inside the substrate; and a first conductive layer formed on the first-surface side of the substrate by means of a first insulation layer made up of a first lower insulation layer and a first upper insulation layer. In such a wiring board, the first lower insulation layer and the first upper insulation layer are made of different materials from each other. Moreover, the first lower insulation layer is positioned on the first surface of the substrate and the electronic component, and the material that forms the first lower insulation layer fills a clearance between the substrate and the electronic component.

10 Claims, 13 Drawing Sheets

U.S. PATENT DOCUMENTS

| | | | |
|---|---|---|---|
| 2008/0063342 A1* | 3/2008 | Ono et al. | 385/88 |
| 2008/0239685 A1* | 10/2008 | Kawabe et al. | 361/782 |
| 2008/0277150 A1* | 11/2008 | Takashima et al. | 174/260 |
| 2009/0115067 A1* | 5/2009 | Okimoto et al. | 257/774 |
| 2009/0174081 A1* | 7/2009 | Furuta | 257/777 |
| 2009/0218118 A1* | 9/2009 | Tani | 174/256 |
| 2009/0237900 A1* | 9/2009 | Origuchi et al. | 361/763 |
| 2009/0293271 A1* | 12/2009 | Tanaka | 29/832 |

FOREIGN PATENT DOCUMENTS

| | | |
|---|---|---|
| JP | 2002-271033 | 9/2002 |
| JP | 2004-31765 | 1/2004 |
| JP | 2005-191156 | 7/2005 |
| JP | 2007-49106 | 2/2007 |
| JP | 2007-258541 | 10/2007 |
| JP | 2007-266197 | 10/2007 |
| JP | 2009-81423 | 4/2009 |

* cited by examiner

WIRING BOARD AND METHOD FOR MANUFACTURING THE SAME

CROSS-REFERENCE TO RELATED APPLICATIONS

The present application claims the benefits of priority to U.S. Application No. 61/182,245, filed May 29, 2009. The contents of that application are incorporated herein by reference in their entirety.

BACKGROUND OF THE INVENTION

1. Field of the Invention

The present invention is related to a wiring board with a built-in electronic component such as an IC chip and a method for manufacturing the same.

2. Discussion of the Background

Japanese Laid-Open Patent Publication 2001-313467 and Japanese Laid-Open Patent Publication 2007-258541 describe a wiring board in which an electronic component is accommodated in a cavity (space) formed in a substrate, the clearance between the electronic component and the wall surface of the cavity is filled with an insulative material, and an interlayer insulation layer is formed on the substrate and on the electronic component. The contents of these publications are incorporated herein by reference in their entirety.

SUMMARY OF THE INVENTION

A wiring board according to one aspect of the present invention is formed with a substrate designating either the upper surface or the lower surface as a first surface and the other as a second surface; an electronic component arranged inside the substrate; and a first conductive layer formed on the first-surface side of the substrate by means of a first insulation layer made up of a first lower insulation layer and a first upper insulation layer. In such a wiring board, the first lower insulation layer and the first upper insulation layer are made of different materials from each other, the first lower insulation layer is positioned on the first surface of the substrate and the electronic component, and the material forming the first lower insulation layer is filled in a clearance between the substrate and the electronic component.

"Arranged inside the substrate" includes cases in which the entire electronic component is embedded completely in the substrate as well as cases in which only part of the electronic component is arranged in the cavity formed in the substrate. In short, it is sufficient if at least part of the electronic component is arranged inside the substrate.

"Different" materials include cases in which materials are composed of different elements as well as cases in which the percentages of elements contained in materials (composition) are different, or the amounts of additives such as inorganic filler are different.

A method for manufacturing a wiring board according to another aspect of the present invention includes the following: preparing a substrate designating either the upper surface or the lower surface as a first surface and the other as a second surface; arranging an electronic component in the substrate; forming a lower insulation layer on the first surface of the substrate; filling a material forming the lower insulation layer in a clearance between the substrate and the electronic component; forming an upper insulation layer made of a different material from that of the lower insulation layer on a surface of the first-surface side of the lower insulation layer; and forming a conductive layer on a surface of the first-surface side of the upper insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
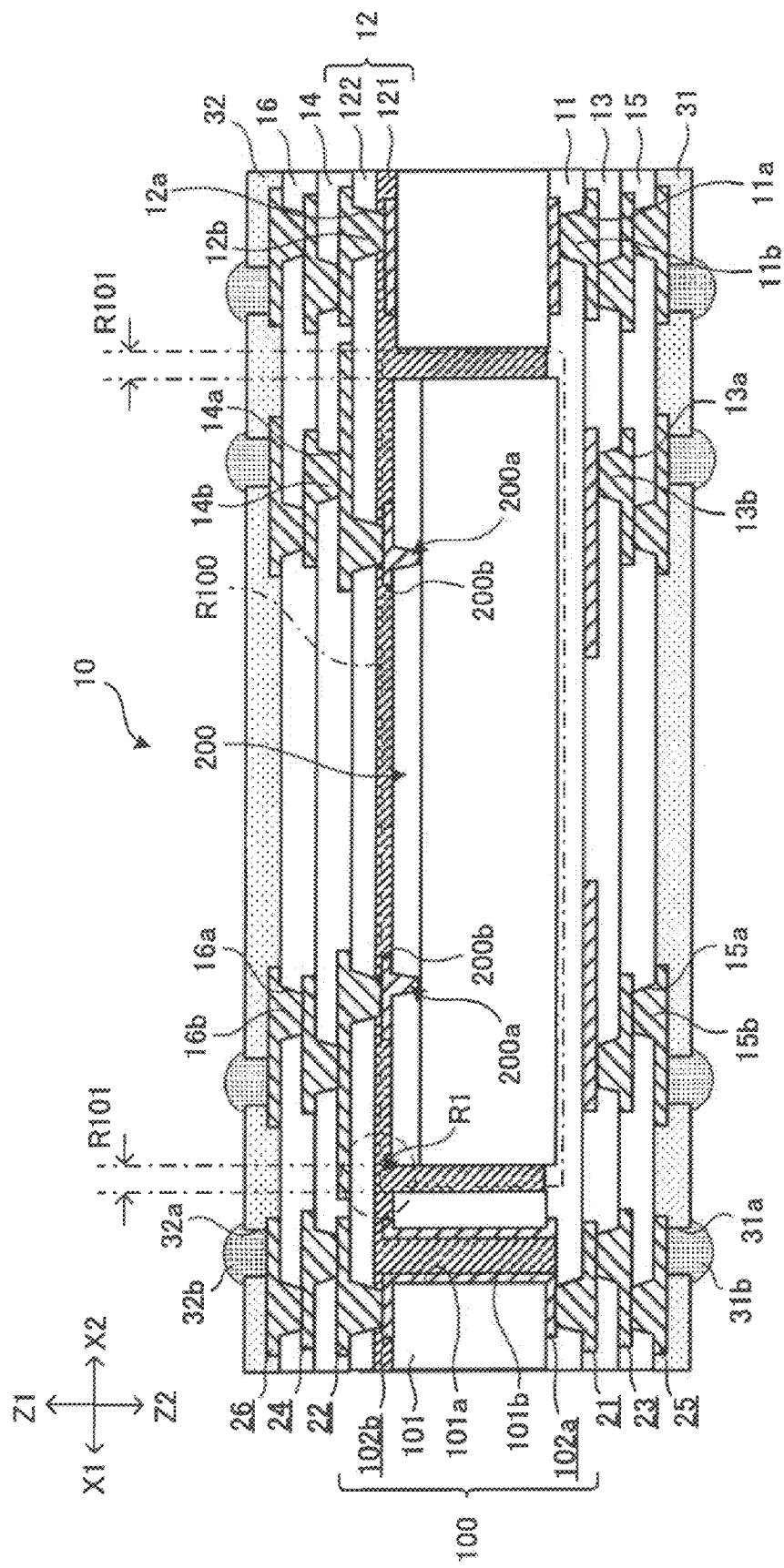
FIG. 1 is a cross-sectional view of a wiring board according to an embodiment of the present invention.

The embodiments will now be described with reference to the accompanying drawings, wherein like reference numerals designate corresponding or identical elements throughout the various drawings.

In the following, a wiring board and its manufacturing method according to an embodiment of the present invention are described with reference to the drawings. In the drawings, arrows (Z1, Z2) respectively indicate the directions in which to laminate the layers of a wiring board, corresponding to the directions along normal lines of the main surfaces (upper and lower surfaces) of the wiring board (or the direction of the thickness of a core substrate). Meanwhile, arrows (X1, X2) and (Y1, Y2) respectively indicate the directions perpendicular to the lamination directions (the directions parallel to the main surfaces of a wiring board). The main surfaces of a wiring board are positioned on X-Y planes. In the following, two main surfaces facing opposite lamination directions are referred to as a first surface (the surface on the arrow-Z1 side) and a second surface (the surface on the arrow-Z2 side). In addition, in each lamination direction, the side closer to a core (substrate 101) is referred to as a lower layer (or an inner layer), and the side farther away from the core is referred to as an upper layer (or an external layer).

Wiring board 10 of the present embodiment has wiring board 100 as a core substrate, electronic component 200 and external connection terminals (31b, 32b), as shown in FIG. 1. Wiring board 10 is a multilayer wiring board configured to be rectangular.

Wiring board 100 is formed with substrate 101, through-hole (101a), conductive film (through-hole conductor) (101b), and wiring layers (102a, 102b). On the second surface of substrate 101, insulation layers 11, 13, 15 as interlayer insulation layers and wiring layers 21, 23, 25 as conductive patterns are laminated. On the first surface of substrate 101, insulation layers 12, 14, 16 as interlayer insulation layers and wiring layers 22, 24, 26 as conductive patterns are laminated.

Substrate 101 is made of epoxy resin, for example. Epoxy resin is preferred to contain a reinforcing material (additive) such as glass fabric or aramid fabric impregnated with resin. Such reinforcing material has a smaller thermal expansion coefficient than the primary material (epoxy resin). The thickness of substrate 101 is 110 µm, for example. The shape, thickness, material and so forth of substrate 101 may be modified according to requirements.

Substrate 101 has through-hole (101a). Conductive film (101b) is formed on the wall surface of through-hole (101a). Furthermore, substrate 101 has space (R100) corresponding to the external shape of electronic component 200.

Electronic component 200 is arranged in space (R100). Electronic component 200 is an IC chip with predetermined circuits integrated on a silicon substrate, for example. The surface of electronic component 200 is made of material with a low dielectric constant (Low-k). The thickness of the substrate of electronic component 200 is 140 µm, for example. Electronic component 200 has multiple pads (200a) on the first surface, but does not have pads on the second surface. Each pad (200a) is made of copper, for example. Electronic component 200 also has extended wiring (200b) electrically connected to pad (200a). The thicknesses of pad (200a) and extended wiring (200b) are each 10 µm, for example. The surface of extended wiring (200b) is roughened. The IC chip referred to here includes a so-called wafer-level CSP, which is formed by forming protective films, terminals, etc., on a wafer, further forming redistribution wiring layers and so forth, then by dicing the wafer into units. Electronic component 200 may have pads (200a) on both of its surfaces (first and second surfaces). The shape, thickness, material, etc. of pads (200a) and extended wiring (200b) may be modified according to usage requirements or the like. For example, pads (200a) may be made of aluminum. In the present embodiment, electronic component 200 is built into wiring board 10. Accordingly, other electronic components or the like may be mounted in the surface mounting region. As a result, high functionality or the like may be achieved.

Wiring layers (102a, 102b) are formed on their respective surfaces (first and second surfaces) of substrate 101. Wiring layer (102a) and wiring layer (102b) are electrically connected to each other by means of conductive film (101b) formed on the wall surface of through-hole (101a). The thickness of wiring layers (102a, 102b) is 20 µm, for example.

On the second surface of substrate 101 and of electronic component 200, insulation layer 11, wiring layer 21, insulation layer 13, wiring layer 23, insulation layer 15, and wiring layer 25 are laminated in that order. The thickness of insulation layers 11, 13, 15 is each 25 µm, for example. The thickness of wiring layers 21, 23, 25 is each 15 µm, for example.

Insulation layer 11 is formed to coat the second surface of electronic component 200 and the surface of wiring layer (102a). At the predetermined spots of insulation layers 11, 13, 15, tapered (for example, cone-shaped) via holes (11a, 13a, 15a) are formed respectively. Conductors (11b, 13b, 15b) are filled in via holes (11a, 13a, 15a) respectively to form filled vias. Such filled vias electrically connect wiring layers 21, 23, 25 with each other. More specifically, conductor (11b) connects wiring layer (102a) and wiring layer 21; conductor (13b) connects wiring layer 21 and wiring layer 23; and conductor (15b) connects wiring layer 23 and wiring layer 25.

On the other hand, on the first surface of substrate 101 and of electronic component 200, insulation layer 12, wiring layer 22, insulation layer 14, wiring layer 24, insulation layer 16, and wiring layer 26 are laminated in that order. The thickness of insulation layer 12 is 45 µm, for example. The thickness of insulation layers (14, 16) is each 25 µm, for example. The thickness of wiring layers (22, 24, 26) is each 15 µm, for example.

Insulation layer 12 is formed to coat the first surface of electronic component 200 and the surface of wiring layer (102b). At the predetermined spots of insulation layers 12, 14, 16, tapered (for example, cone-shaped) via holes (12a, 14a, 16a) are formed respectively. Conductors (12b, 14b, 16b) are filled in via holes (12a, 14a, 16a) respectively to form filled vias. Such filled vias electrically connect wiring layers 22, 24, 26 with each other. More specifically, conductor (12b) connects wiring layer (102b) and wiring layer 22; conductor (14b) connects wiring layer 22 and wiring layer 24; and conductor (16b) connects wiring layer 24 and wiring layer 26. As a result, pads (200a) (connection terminals) of electronic component 200 and wiring layer 22 (conductive pattern) are electrically connected by means of via hole (12a) and conductor (12b) inside the via hole which penetrate insulation layer 12 (first insulation layer).

Here, insulation layer 12 is made up of insulation layer 121 and insulation layer 122. Namely, insulation layers 121, 122 are formed between wiring layer 22 (first conductive layer) and substrate 101; here, wiring layer 22 is positioned lowermost among wiring layers 22, 24, 26 as viewed from substrate 101. Since insulation layer 12 is made up of multiple layers (two layers) of insulation layers 121, 122, even if cracks occur near external connection terminal (32b) due to impact from outside or thermal force, progress of such cracks may be interrupted or suppressed at the interface between insulation layer 121 and insulation layer 122. Thus, it is thought that such cracks will seldom reach electronic component 200. As a result, even if electronic component 200 contains fragile material with a low dielectric constant (Low-k), it is thought that electronic component 200 will seldom malfunction.

Insulation layer 121 and insulation layer 122 are made of different materials. More specifically, the amount of inorganic filler contained in insulation layer 121 is greater than the amount of inorganic filler contained in insulation layer 122. The specific amount of inorganic filler contained in insulation layer 121 is set at 50 wt. %, for example. By contrast, the amount of inorganic filler contained in insulation layer 122 is set at 38 wt. %, for example. In so being set, the coefficient of thermal expansion (CTE) of insulation layer 121 becomes smaller than the CTE of insulation layer 122. The CTE of insulation layer 121 is set at 16-19 ppm/° C., for example. The CTE of insulation layer 122 is set at 46 ppm/° C. The material for insulation layer 122 positioned as the uppermost layer of insulation layer 12 (first insulation layer) is the same as the material for insulation layer 11 (second insulation layer).

The thickness of insulation layer 122 is greater than that of insulation layer 121. More specifically, the thickness of insulation layer 121 is 20 µm, for example. By contrast, the thickness of insulation layer 122 is 25 µm, for example. The thickness of insulation layer 122 is the same as that of insulation layer 11.

Electronic component 200 is completely enveloped by insulation layers 11, 12. The peripheral portion (clearance R101) between electronic component 200 and substrate 101 is filled with material (such as resin) that forms insulation layer 121 (first lower insulation layer) positioned lowermost among the layers that make up insulation layer 12 (first insulation layer) on the first-surface side. In doing so, electronic component 200 is protected by insulation layers 11, 12 as well as being fixed in a predetermined position. Also, through-hole (101a) is filled with the material that forms insulation layer 121. As a result, connection reliability is improved in conductive film (through-hole conductor) (101b).

Figure 2:
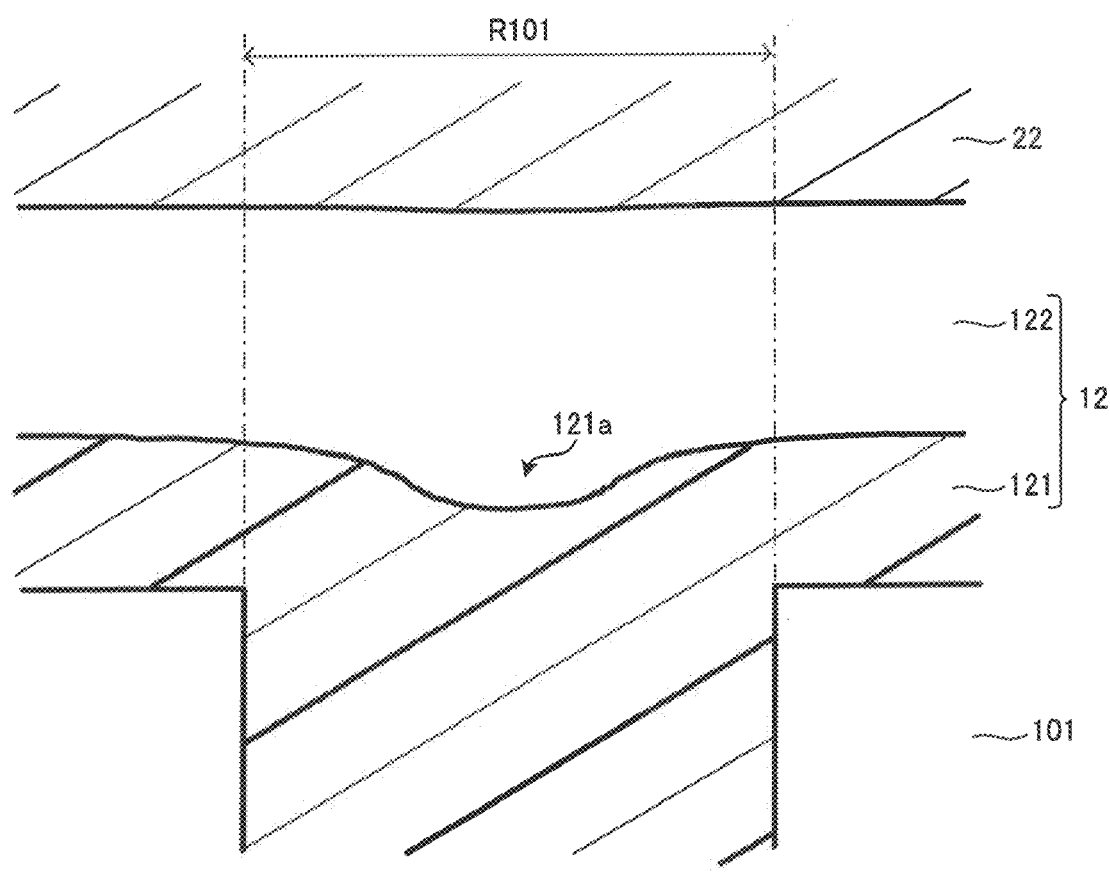
FIG. 2 is a magnified view showing part of FIG. 1.

In clearance (R101) between electronic component 200 and substrate 101, as shown in FIG. 2 (magnified view of region (R1) in FIG. 1), recess (121a) is formed on the first surface of insulation layer 121. In insulation layer 12 (first insulation layer), insulation layer 122 positioned on insulation layer 121 fills the recess (121a). Accordingly, even in the region directly on clearance (R101), the first surface of insulation layer 122 may be leveled without going through surface treatments such as polishing. Therefore, fine patterns and external connection terminals (32b) with a uniform height may be formed on the surface of insulation layer 122 (insulation layer 12). Such lamination conditions are substantially the same as in through-hole (101a).

Insulation layers 11-16 are each made of cured prepreg, for example. As for such prepreg, the following are used: base materials such as glass fabric or aramid fabric impregnated with resins such as epoxy resin, polyester resin, bismaleimide triazine resin (BT resin), imide resin (polyimide), phenol resin or allyl polyphenylene ether resin (A-PPE resin). Insulation layers 11-16 each contain filler as an additive.

Wiring layers 21-26 and conductors (11b-16b) are each made of copper-plated film, for example. Thus, reliability is high in the connection portions between electronic component 200 and wiring layer 22.

The shape, material, etc. of each of insulation layers 11-16, wiring layers 21-26 and conductors (11b-16b) are not limited to those described above and may be modified according to usage requirements or the like. For example, metals other than copper may be used for wiring layers 21-26 or conductors (11b-16b). Also, as the material for insulation layers 11-16, liquid or film-type thermosetting resins or thermoplastic resins, or resin-coated copper foil (RCF) may be used instead of prepreg. As for thermosetting resins, resins such as epoxy resin, imide resin (polyimide), BT resin, allyl polyphenylene ether resin or aramid resin may be used. As for thermoplastic resins, resins such as liquid crystalline polymer (LCP), PEEK resin or PTFE resin (fluororesin) may be used. Such materials are preferred to be selected according to requirements from the viewpoint of insulation, dielectric properties, heat resistance, mechanical features or the like, for example. Also, the above resins may contain additives such as curing agents or stabilizers.

Solder-resist layer 31 with opening portions (31a) is formed on the second surface of insulation layer 15. Also, on the first surface of insulation layer 16, solder-resist layer 32 with opening portions (32a) is formed. Wiring layers 25, 26 are exposed through opening portions (31a, 32a) respectively. Solder-resist layers 31, 32 are each made of resin such as photosensitive resin using acrylic-epoxy resin, thermosetting resin mainly containing epoxy resin or ultraviolet setting resin. The thickness of solder-resist layers 31, 32 formed on wiring layers 25, 26 is each 15 µm, for example.

In opening portions (31a, 32a), external connection terminals (31b, 32b) made of solder are formed respectively. External connection terminals (31b, 32b) are arranged on wiring layers 25, 26 exposed through opening portions (31a, 32a). Accordingly, external connection terminals (31b, 32b) are electrically connected to wiring layers 25, 26.

In the present embodiment, by using different materials for insulation layer 121 and insulation layer 122 which make up insulation layer 12, insulation layer 121 and insulation layer 122 have different characteristics. More specifically, by decreasing the amount of inorganic filler contained in insulation layer 122, the CTE of insulation layer 122 is kept higher; and by increasing the amount of inorganic filler contained in insulation layer 121, the CTE of insulation layer 121 is set lower. By maintaining a high level of CTE in insulation layer 122, excellent adhesiveness may be achieved between insulation layer 122 (insulation layer 12) and wiring layer 22. As a result, the reliability of electrical characteristics in wiring board 10 will become excellent. In addition, by setting a low level of CTE in insulation layer 121, the CTE mismatch dissipates in electronic component 200 and insulative material (the material forming insulation layer 121) in clearance (R101) between electronic component 200 and substrate 101. Accordingly, delamination of insulative material may be suppressed at the interface with electronic component 200.

Moreover, insulation layer 121 with a low CTE is arranged on the first-surface side where pads (200a) (connection terminals) of electronic component 200 are formed. Thus, during heat cycles while being used, faulty connections are suppressed near connection terminals (pads 200a) of electronic component 200.

In the following, simulation results regarding the above effects are described with reference to FIGS. 3A-5. A simulation examiner carried out simulations on sample Legs 1-6 having the structures shown in FIGS. 3A, 3B.

Figure 3A:
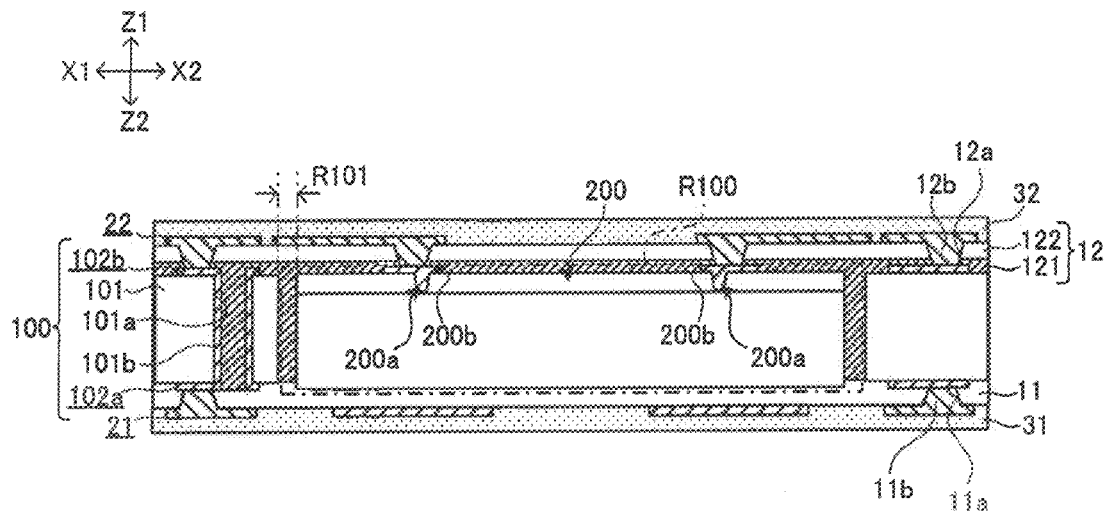
FIG. 3A is a view showing a first structure of a sample to be used in simulations.

As shown in FIG. 3A, sample Legs 5 and 6 each have a two-layer structure simplified from the six-layer structure of wiring board 10. In sample Legs 5 and 6, insulation layers 13-16, opening portions (31a, 32a) and external connection terminals (31b, 32b) are not formed. In addition, the thickness of each layer is different from that in wiring board 10. More specifically, the thickness of electronic component 200 is set at 140 µm; the thickness of pad (200a) and extended wiring (200b) is set at 10 µm each; the thickness of substrate 101 is set at 110 µm; the thickness of wiring layers (102a, 102b) is set at 20 µm each; the thickness of insulation layer 11 is set at 30 µm; the thickness of insulation layer 121 is set at 10 µm; the thickness of insulation layer 122 is set at 20 urn; the thickness of wiring layers 21, 22 is set at 15 µm each; and the thickness of solder-resist layers 31, 32 is set at 15 µm each, for example.

Figure 3B:
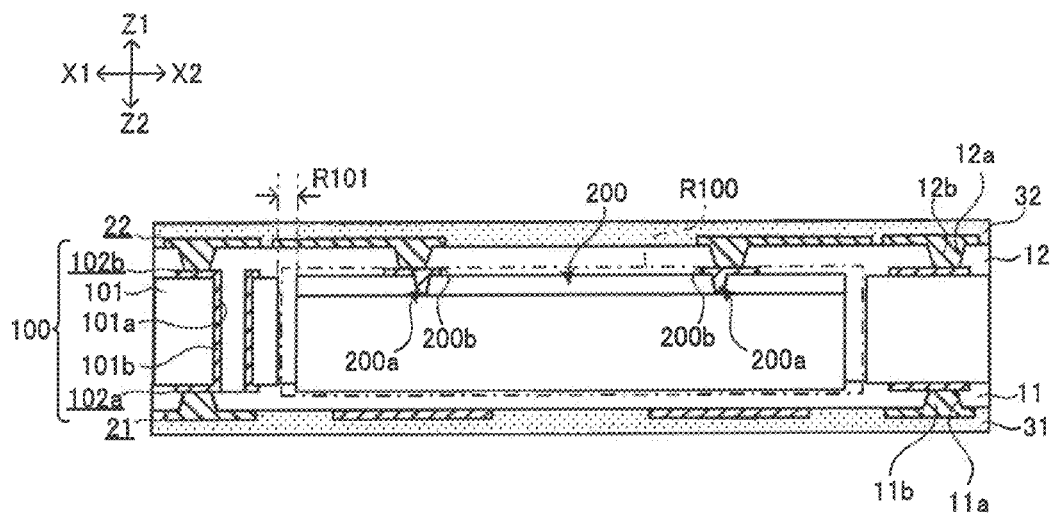
FIG. 3B is a view showing a second structure of a sample to be used in simulations.

Meanwhile, sample Legs 1-4 also have the same structure as that of sample Legs 5 and 6. However, in sample Legs 1-4, insulation layer 12 is made of a single material, as shown in FIG. 3B.

In sample Leg 1, insulation layers 11, 12 each have a CTE of 46 ppm/° C.; in sample Leg 2, insulation layers 11, 12 each have a CTE of 30 ppm/° C.; in sample Leg 3, insulation layers 11, 12 each have a CTE of 19 ppm/° C.; in sample Leg 4, insulation layers 11, 12 each have a CTE of 16 ppm/° C.; in sample Leg 5, insulation layers 11, 122 each have a CTE of 46 ppm/° C. and insulation layer 121 has a CTE of 19 ppm/° C.; and in sample Leg 6, insulation layers 11, 122 each have a CTE of 46 ppm/° C. and insulation layer 121 has a CTE of 16 ppm/° C.

The simulation examiner measured the stresses when the above sample Legs 1-6 were cooled from a temperature of 180° C. to minus 40° C. At that time, using a sub-modeling method, an entire package was analyzed and stress was calculated in each of the detailed portions (FIGS. 3A, 3B). A sub-modeling method indicates that by imputing the analysis results from a global model (full model) to a model in which detailed portions are reproduced (sub-model), the detailed model is analyzed while the reaction of the global model is considered.

Figure 4:
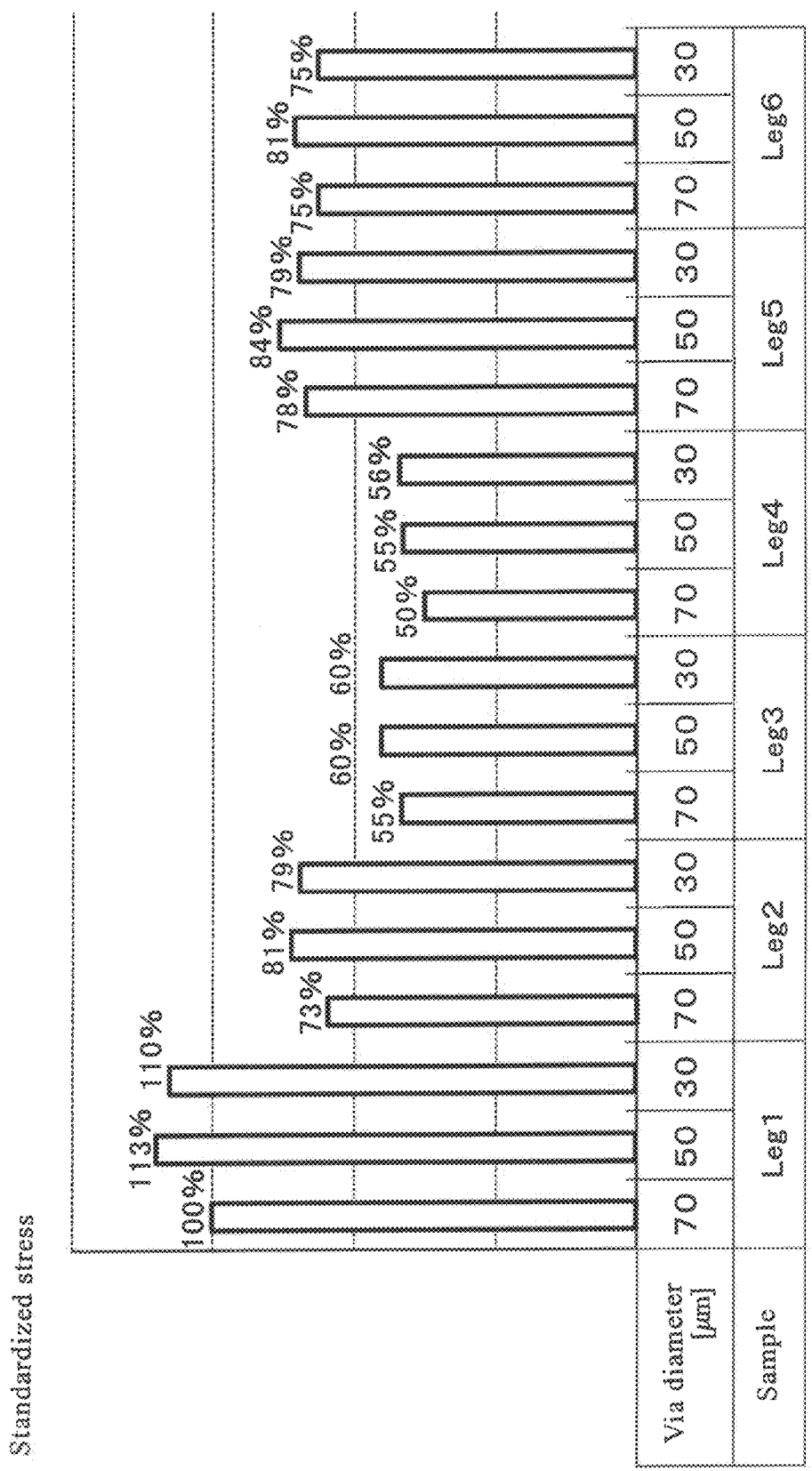
FIG. 4 is a graph showing the results of the first simulation.
Figure 5:
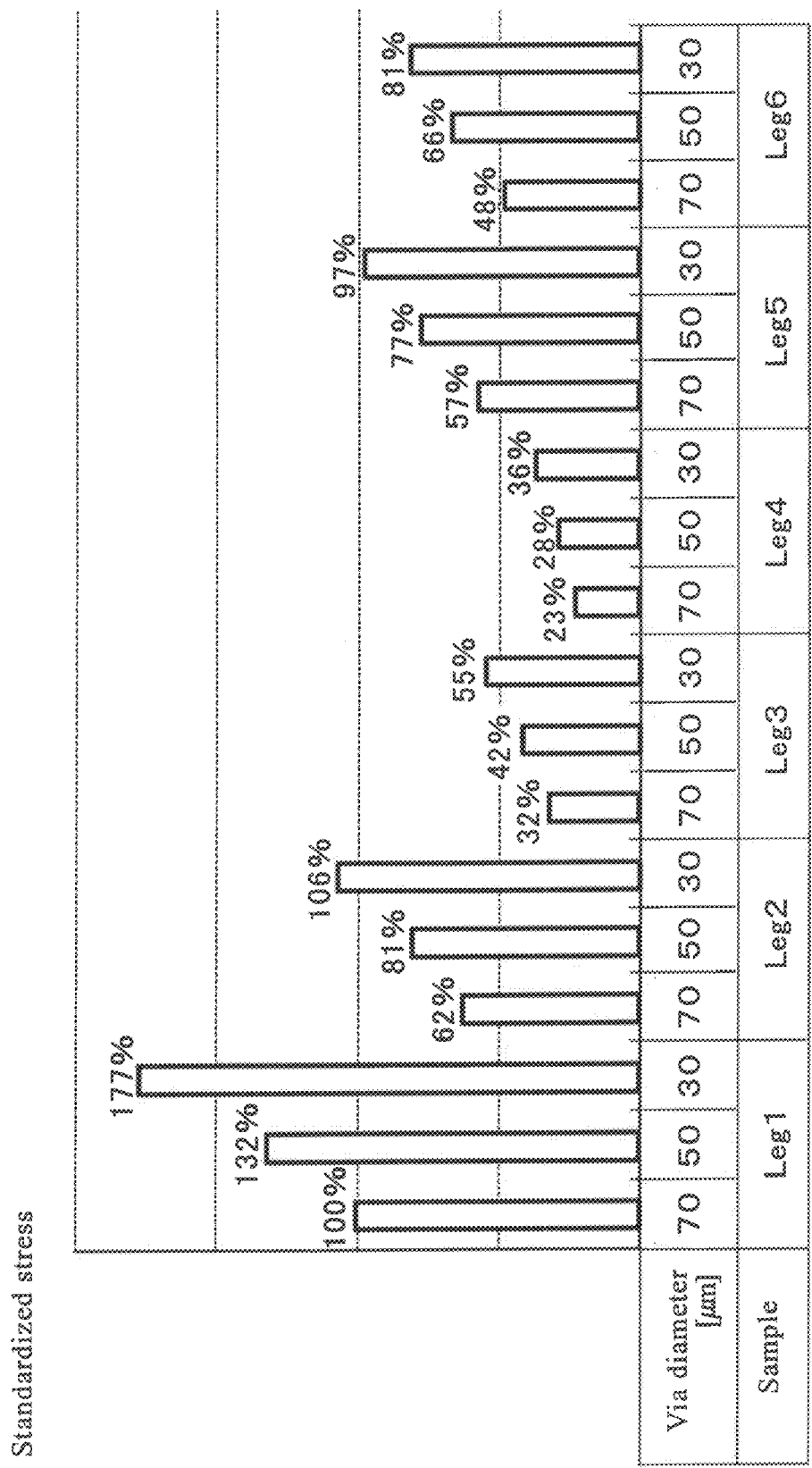
FIG. 5 is a graph showing the results of the second simulation.

The simulation results of sample Legs 1-6 are shown in FIGS. 4-5. The examiner measured the following: stresses in the lamination directions (in the directions of arrows Z1 and Z2) of sample Legs 1-6 when the diameters of via holes (11a, 12a) are set at 30 μm, 50 μm and 70 μm. FIG. 4 is a graph showing standardized stresses in each sample measured at the surface portion (the portion of a Low-k material) of electronic component 200. FIG. 5 is a graph showing standardized stresses in each sample measured around via holes (11a, 12a). Here, a standardized stress indicates stresses in each sample when the stress measured in sample Leg 1 where via holes (11a, 12a) each have a diameter of 70 μm is set at 100%.

As shown in the graphs of FIGS. 4-5, stresses measured in sample Legs 1-4 with any of the above diameters increased in sample Leg 4, sample Leg 3, sample Leg 2 and sample Leg 1 in that order. In sample Leg 1, since the stresses are great, there is a concern about delamination of the insulative material at clearance (R101). Meanwhile, in sample Legs 2-4, although the results regarding stresses were excellent, the adhesiveness between insulation layer 12 and wiring layer 22 was not excellent; especially, in sample Leg 4, wiring layer 22 was peeled from insulation layer 12. By contrast, in sample Legs 5 and 6, excellent results were obtained in adhesiveness between insulation layer 12 and wiring layer 22, and the results regarding stresses were substantially the same as in sample Leg 2. In sample Leg 6, stresses were smaller than those in sample Leg 5.

From the above simulation results, the following may be assumed: By setting the thermal expansion coefficient of insulation layer 121 smaller than the thermal expansion coefficient of insulation layer 122, excellent results are obtained in the stress caused by thermal changes or the like as well as in adhesiveness between insulation layer 12 and wiring layer 22. In wiring board 10 of the present embodiment, the CTE of insulation layer 122 is kept high by decreasing the amount of inorganic filler contained in insulation layer 122, and the CTE of insulation layer 121 is kept low by increasing the amount of inorganic filler contained in insulation layer 121. Accordingly, in wiring board 10, excellent properties may be achieved regarding stresses caused by thermal changes or the like as well as regarding the adhesiveness between insulation layer 12 and wiring layer 22.

Wiring board 10 is manufactured through the following procedure, for example.

Figure 6A:
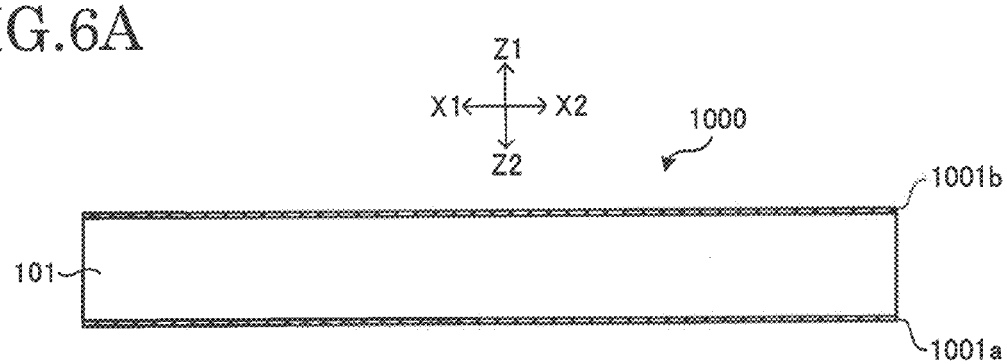
FIGS. 6A-6D are views illustrating steps to manufacture a core substrate of a wiring board according to the present embodiment.

Copper-clad laminate 1000 is prepared as shown in FIG. 6A. Copper-clad laminate 1000 has substrate 101 made of epoxy resin, for example, and copper foils (1001a, 1001b). On the second surface of substrate 101, copper foil (1001a) is laminated; and on the first surface of substrate 101, copper foil (1001b) is laminated.

Figure 6B:
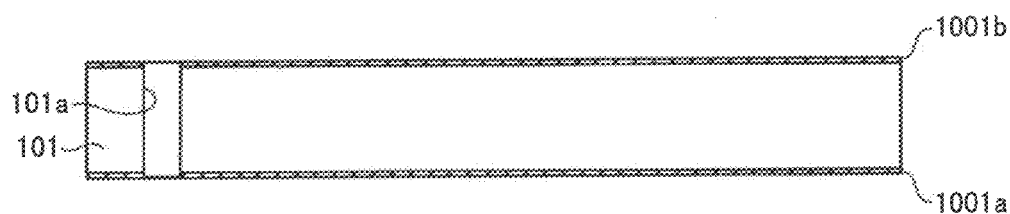

Copper-clad laminate 1000 is set in laser processing equipment. Then, either the first surface or the second surface of copper-clad laminate 1000 is irradiated with a laser. Accordingly, through-hole (101a) is formed as shown in FIG. 6B.

Figure 6C:
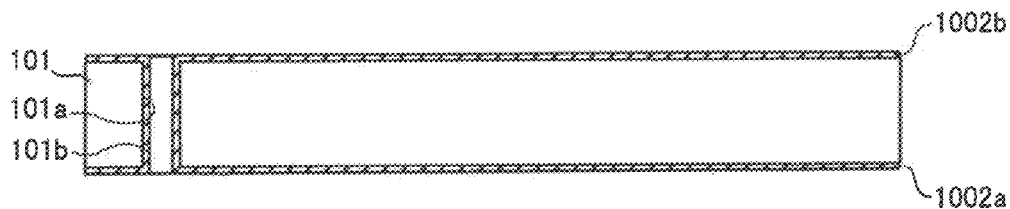

Electroless copper plating is performed, for example. Accordingly, on the surfaces of the substrate including the wall surface of through-hole (101a), electroless plated-metal film is formed, which is then used as a seed layer to perform electrolytic copper plating, for example. In doing so, as shown in FIG. 6C, plated-metal film (1002a) is formed on the second surface of substrate 101; and plated-metal film (1002b) is formed on the first surface of substrate 101. Also, conductive film (through-hole conductor) (101b) is formed on the wall surface of through-hole (101a).

Figure 6D:
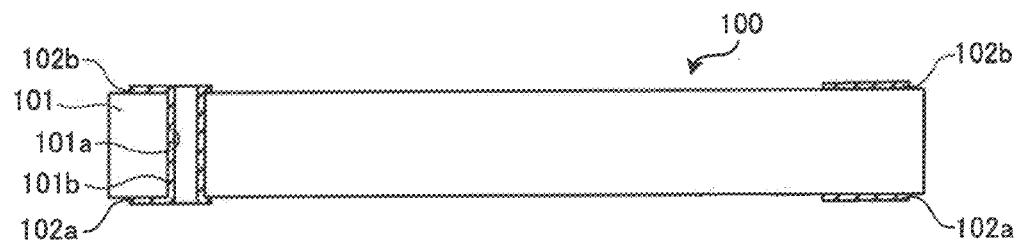

Plated-metal films (1002a, 1002b) are patternd by etching, for example. In doing so, as shown in FIG. 6D, wiring layer (102a) is formed on the second surface of substrate 101; and wiring layer (102b) is formed on the first surface of substrate 101. As a result, wiring board 100 is manufactured.

Using wiring board 100 as a core substrate, multilayer printed wiring board (wiring board 10) is manufactured.

Figure 7A:
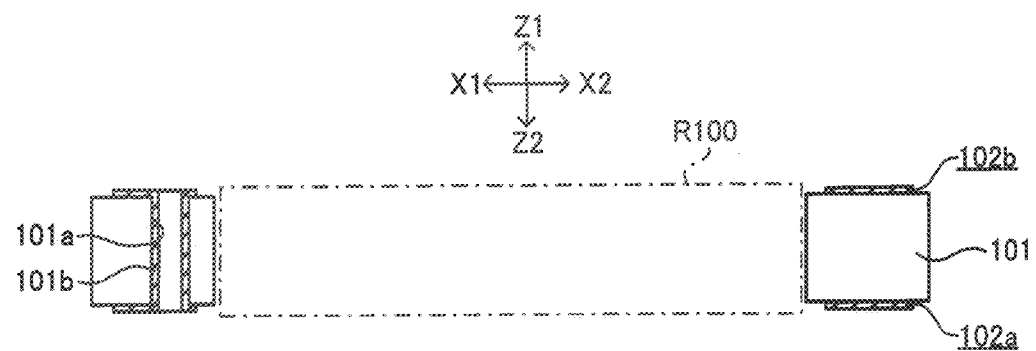
FIGS. 7A-7C are views illustrating steps to arrange an electronic component inside a core substrate.

Space (R100) is formed by drilling a hole in substrate 101 using a laser or the like, as shown in FIG. 7A, for example.

Figure 7B:
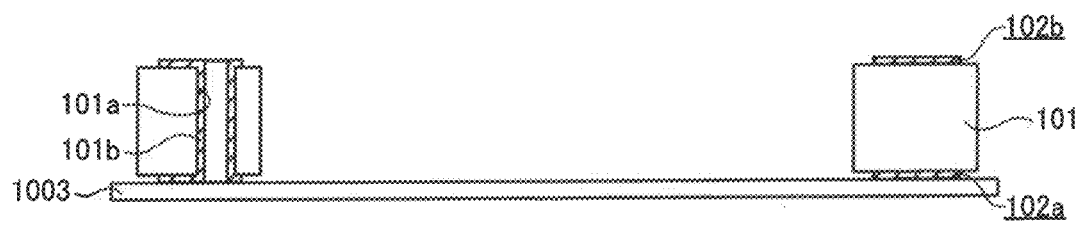

Carrier 1003 made of PET (polyethylene terephthalate) is arranged on one surface (for example, the second surface) of substrate 101, as shown in FIG. 7B, for example. Carrier 1003 is laminated and adhered to the substrate, for example.

Figure 7C:
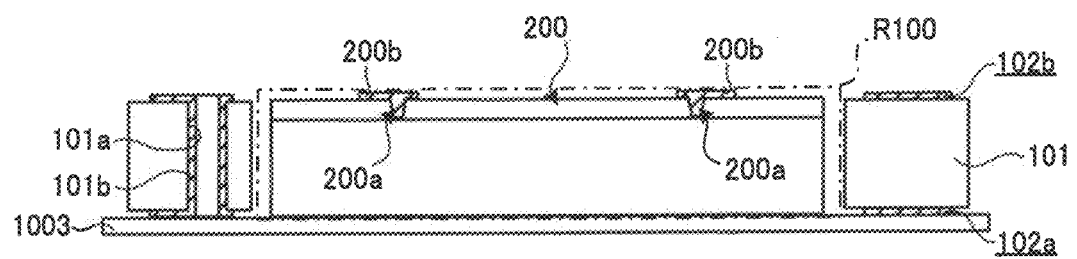

As shown in FIG. 7C, electronic component 200 is mounted on carrier 1003 (specifically, in space (R100)) at room temperature, for example, in such a way that pad (200a) of electronic component 200 faces the first surface (the surface opposite carrier 1003). On the first surface of electronic component 200, formed are pad (200a) and extended wiring (200b) which is electrically connected to pad (200a). The surface of wiring (200b) extended from pad (200a) is roughened. Such a roughened surface of extended wiring (200b) is usually formed at the time extended wiring (200b) is formed. However, if required, the surface may be roughened using chemicals or the like after extended wiring (200b) is formed.

Figure 8A:
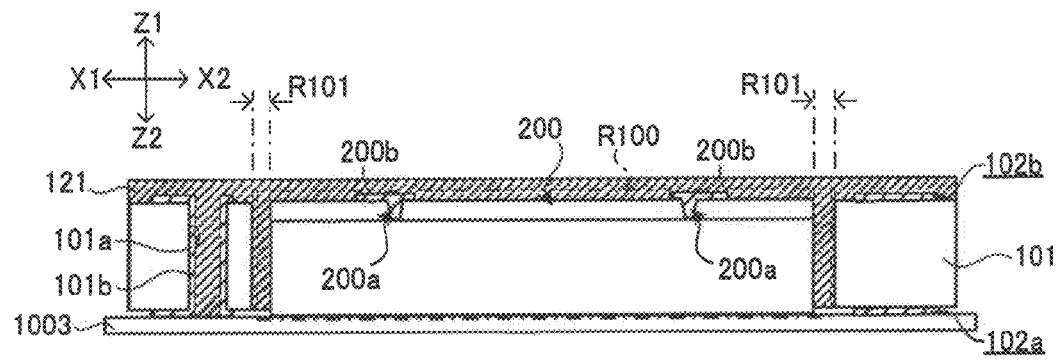
FIGS. 8A-8C are views illustrating steps to form a first interlayer insulation layer on both surfaces of the core substrate.

Insulation layer 121 is formed using a vacuum laminator, for example, to coat the first surface of electronic component 200 and of substrate 101, as shown in FIG. 8A. In doing so, pad (200a) is coated with insulation layer 121. Moreover, insulation layer 121 is melted by heat and fills space (R100). As a result, the material forming insulation layer 121 (insulative material) is filled in clearance (R101) between electronic component 200 and substrate 101. Accordingly, electronic component 200 is fixed in a predetermined position. Also, through-hole (101a) is filled with the material (insulative material) forming insulation layer 121.

Figure 8B:
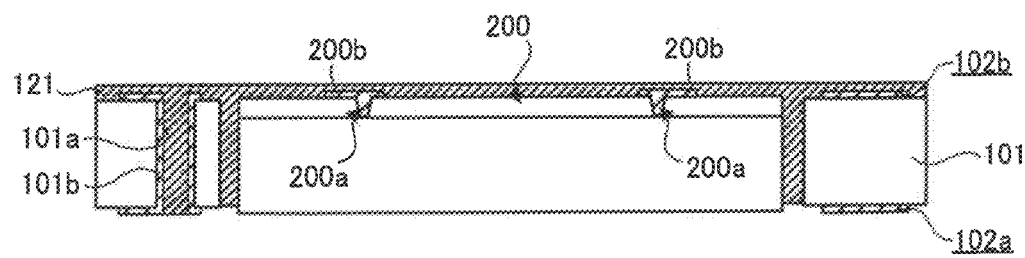

Carrier 1003 is peeled and removed from the second surface (the surface opposite insulation layer 121) of substrate 101, as shown in FIG. 8B.

Figure 8C:
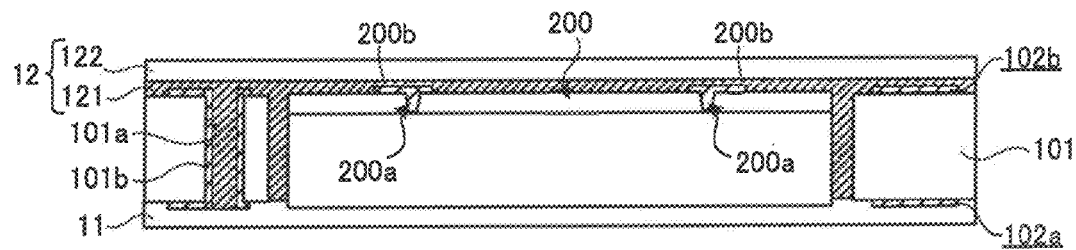

As shown in FIG. 8C, insulation layer 11 is formed on the second surface of substrate 101, and insulation layer 122 on the first surface of insulation layer 121. Accordingly, insulation layer 12 is formed on the first surface of substrate 101. Also, electronic component 200 is arranged inside substrate 101. In the present embodiment, since the material and thickness of insulation layer 122 are the same as those of insulation layer 11 (second insulation layer), it is easy to form insulation layers 11, 12.

Figure 9A:
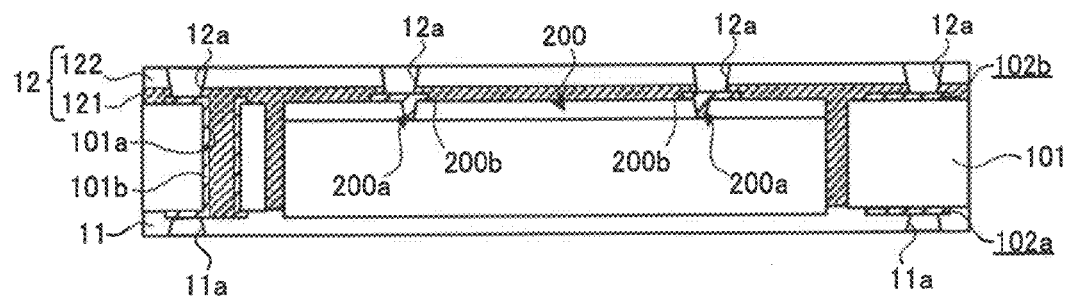
FIG. 9A is a view illustrating a step to form a via hole in the first interlayer insulation layer.

As shown in FIG. 9A, tapered (such as cone-shaped) via holes (11a, 12a) are formed in insulation layers 11, 12 respectively using a laser or the like.

Figure 9B:
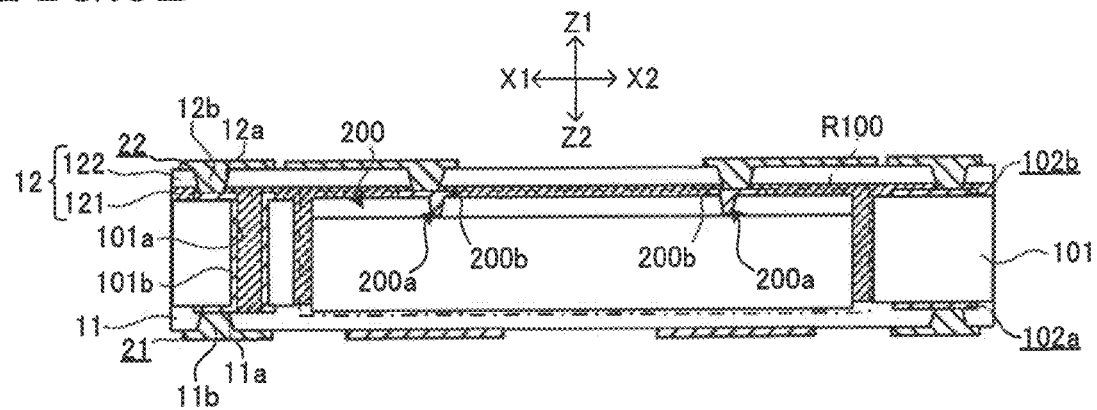
FIG. 9B is a view illustrating a step to form a first conductive layer on the first interlayer insulation layer.

Conductive patterns are formed using a semi-additive method, for example. More specifically, the first and second surfaces are coated with a patterned plating resist, and electrolytic plating is selectively performed on the portions where the resist is not formed. Accordingly, as shown in FIG. 9B, wiring layer 21 and conductor (11b) are formed on the second surface of insulation layer 11; and wiring layer 22 and conductor (12b) are formed on the first surface of insulation layer 12. As a result, a filled via made of via hole (11a) and conductor (11b) as well as a filled via made of via hole (12a) and conductor (12b) are each formed. At that time, part of the conductive pattern of wiring layer 22 is formed in the region directly on clearance (R101).

Figure 10A:
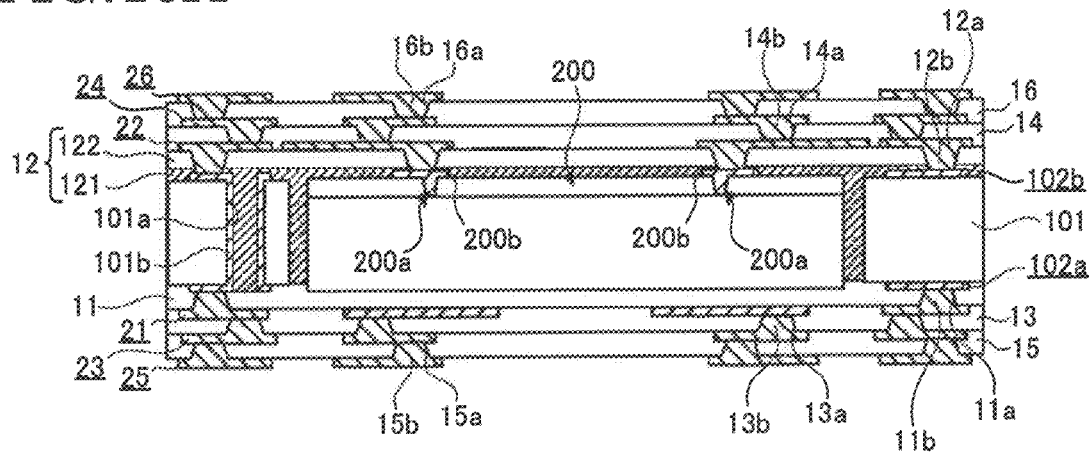
FIG. 10A is a view illustrating a step to form second and third interlayer insulation layers on both surfaces of the core substrate.

Using the same procedure for insulation layers 11, 12 and wiring layers 21, 22, insulation layer 13, wiring layer 23, insulation layer 15 and wiring layer 25 are laminated in that order on the second surface of substrate 101; and insulation layer 14, wiring layer 24, insulation layer 16 and wiring layer 26 are laminated in that order on the first surface of substrate 101. Also, using the same procedure for via holes (11a, 12a) and conductors (11b, 12b), via holes (13a, 15a) and conductors (13b, 15b) are formed in insulation layers 13, 15; and forms via holes (14a, 16a) and conductors (14b, 16b) in insulation layers 14, 16. As a result, as shown in FIG. 10A, wiring layers 21, 23, 25 are electrically connected to each other by means of conductors (11b, 13b, 15b); and wiring layers 22, 24, 26 are electrically connected to each other by means of conductors (12b, 14b, 16b).

Any method may be employed when forming wiring layers 21 and others. For example, instead of a semi-additive method, a subtractive method (a method to pattern the layers by etching) may also be used.

Figure 10B:
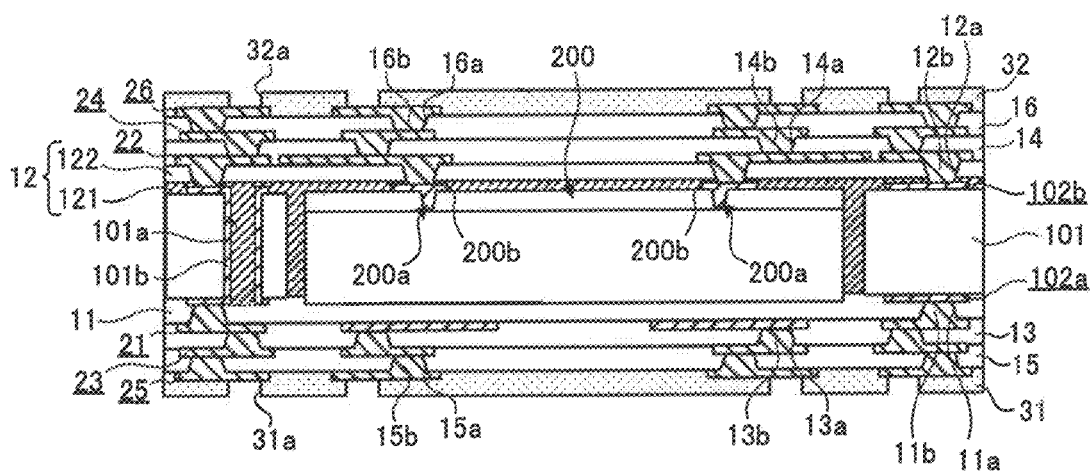
FIG. 10B is a view illustrating a step to form a solder-resist layer on both surfaces of the core substrate.

As shown in FIG. 10B, solder-resist layer 31 with opening portions (31a) and solder-resist layer 32 with opening portions (32a) are formed using screen printing, spray coating, roll coating or the like. Wiring layers 25, 26 are exposed respectively in opening portions (31a, 32a).

Solder paste is applied, for example, in opening portions (31a, 32a) and the paste is cured by a thermal treatment such as reflow, for example, to form external connection terminals (31b, 32b) (FIG. 1). External connection terminals (31b, 32b) are electrically connected to wiring layers 25, 26 respectively.

Through the above procedure, wiring board 10 is obtained as previously shown in FIG. 1.

According to wiring board 10 of the present embodiment, performance degradation caused by stresses may be suppressed in the wiring board. Also, electronic component 200 may be made fine-pitched. In addition, quality such as connection reliability will be enhanced in wiring board 10.

According to the method for manufacturing wiring board 10 of the present embodiment, wiring board 10 may be manufactured with a simplified procedure.

So far, a wiring board and its manufacturing method according to an embodiment of the present invention are described. However, the present invention is not limited to such. For example, the present invention may be carried out by making the following modifications.

Figure 11:
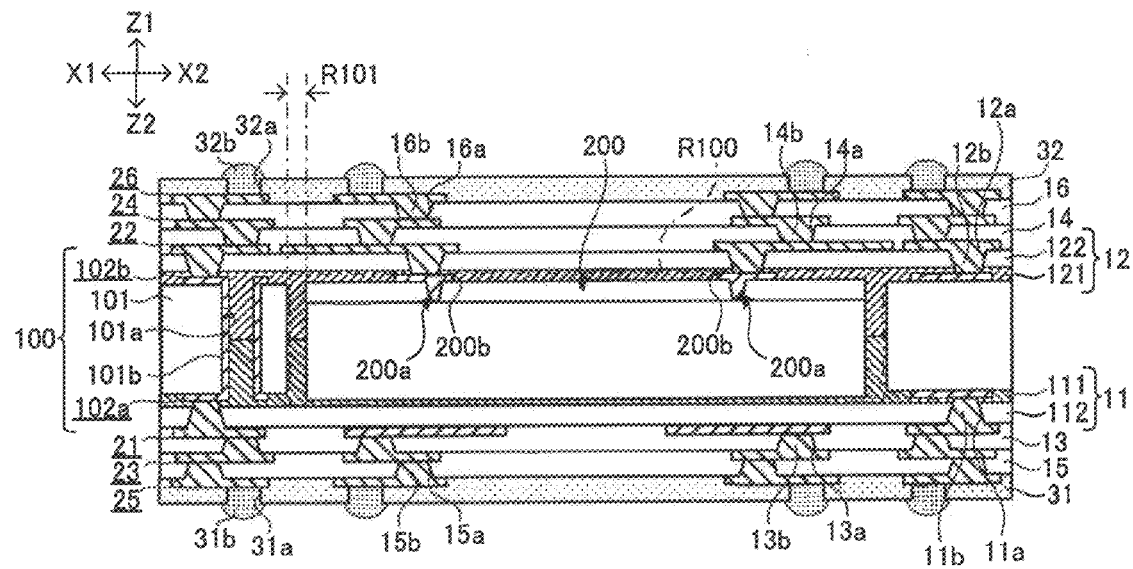
FIG. 11 is a view showing an example of a wiring board in which a first interlayer insulation layer is each formed with multiple layers on both the first-surface side and the second-surface side.

For example, as shown in FIG. 11, not only insulation layer 12 on the first-surface side but also insulation layer 11 on the second-surface side may be formed with multiple layers. In the example shown in FIG. 11, insulation layers 111, 112 (second insulation layer) made of different materials from each other are formed between wiring layer 21 (second conductive layer) and substrate 101. Here, wiring layer 21 is the layer positioned lowermost among wiring layers 21, 23, 25 on the second-surface side as viewed from substrate 101. Also, in addition to the material that forms insulation layer 121, the material that forms insulation layer 111 (second lower insulation layer) positioned lowermost among insulation layers 111, 112 (second insulation layer) is also filled in clearance (R101) between substrate 101 and electronic component 200. Such a wiring board may be manufactured by filling one material in clearance (R101) and then by filling another material, for example. According to such a structure, both surfaces of electronic component 200 may be enveloped by the materials forming insulation layers 111, 121.

Figure 12:
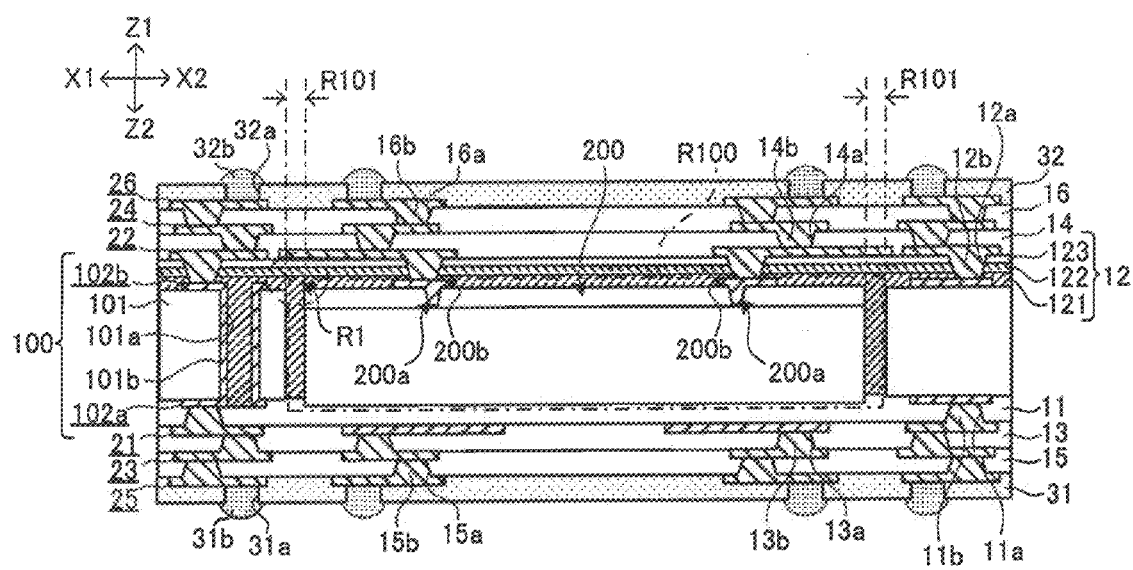
FIG. 12 is a view showing an example of a wiring board in which the first interlayer insulation layer is formed with three or more layers.

Insulation layers 11, 12 may be formed with three or more layers. For example, as shown in FIG. 12, insulation layer 12 may be a three-layer format with insulation layers 121, 122, 123 made of different materials from each other. In such a case, it is also preferred that the thermal expansion coefficient of insulation layer 121, which is positioned as the lowermost layer, be the smallest among the three layers.

Figure 13:
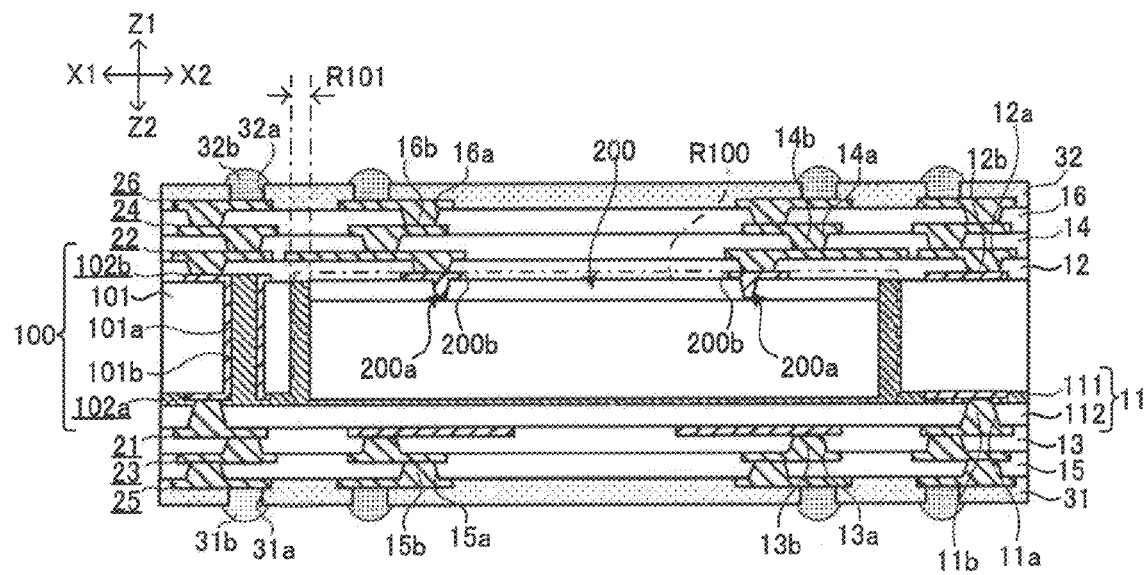
FIG. 13 is a view showing an example of a wiring board in which a low CTE insulation layer is arranged either on the upper or lower surface of the electronic component where connection terminals are not formed.

In the above embodiment, insulation layer 121 with a low CTE is arranged on the first-surface side where pads (200a) (connection terminals) of electronic component 200 are formed. However, the present invention is not limited to such. For example, as shown in FIG. 13, insulation layer 111 on the second-surface side may be set to have a low CTE. However, to suppress faulty connections around connection terminals (pads 200a) of electronic component 200, insulation layer 121 on the connection terminal side (first-surface side) is preferred to have a low CTE.

In the above embodiment, the materials of the two layers to form insulation layer 12, namely the material for insulation layer 121 and the material for insulation layer 122, differ in the amount of inorganic filler contained in each layer. However, the present invention is not limited to such. If at least insulation layers 121, 122 are made of different materials from each other, by separately adjusting the properties of insulation layers 121, 122, adhesiveness may be ensured in wiring layer 22, and the properties in insulation layer 12 may also be improved to form fine patterns (fine wiring). For example, the amount of additives, other than inorganic fillers, may be set to be different. Also, among the materials listed for insulation layers 11-16, one material may be selected as the material for insulation layer 121 and another material may be selected as the material for insulation layer 122.

In the above embodiment, the position, size and shape of each hole, and the material, size, pattern and the number of layers for each layer may be modified unless such modifications deviate from the gist of the present invention.

For example, after the structure shown in FIG. 10A is completed, the lamination process may be continued to make a further multilayer (for example, eight-layer) wiring board. Alternatively, a wiring board may be manufactured with fewer layers (for example, two layers or four layers). Also, the number of layers may be different on each surface (first surface, second surface) of wiring board 100. Moreover, layers (wiring layers and insulation layers) may be formed (laminated) on only one surface (specifically, one surface of the core substrate) of wiring board 100.

Figure 14:
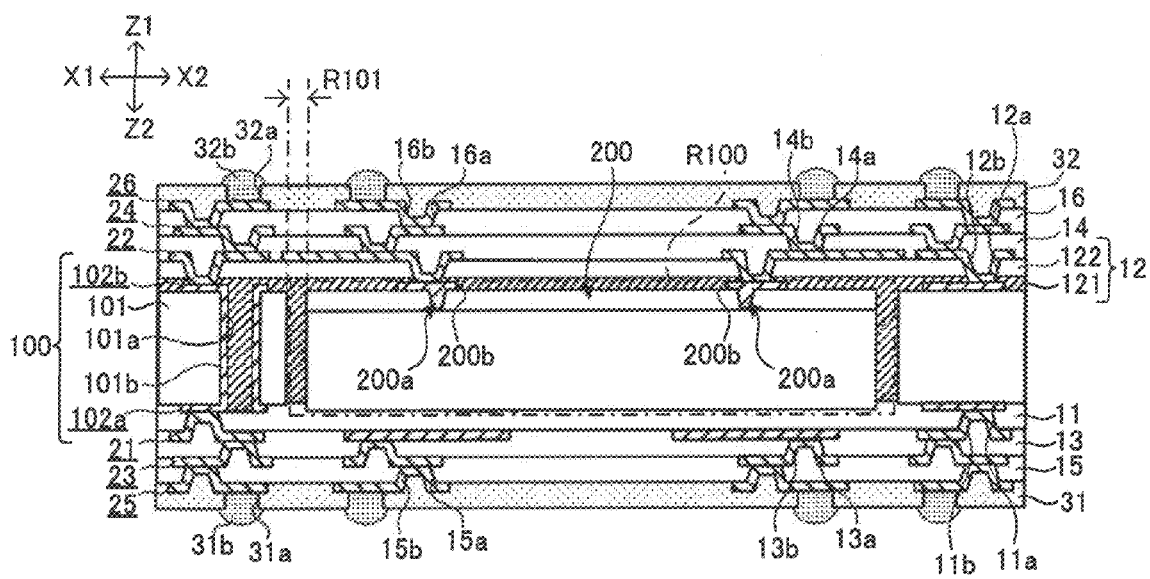
FIG. 14 is a view showing an example of a wiring board having conformal vias.

It is not always required to form part of the conductive pattern of wiring layer 22 in the region directly on clearance (R101). Also, via holes (11a-16a) in wiring board 10 are not limited to those forming filled vias. For example, as shown in FIG. 14, they may form conformal vias.

Figure 15:
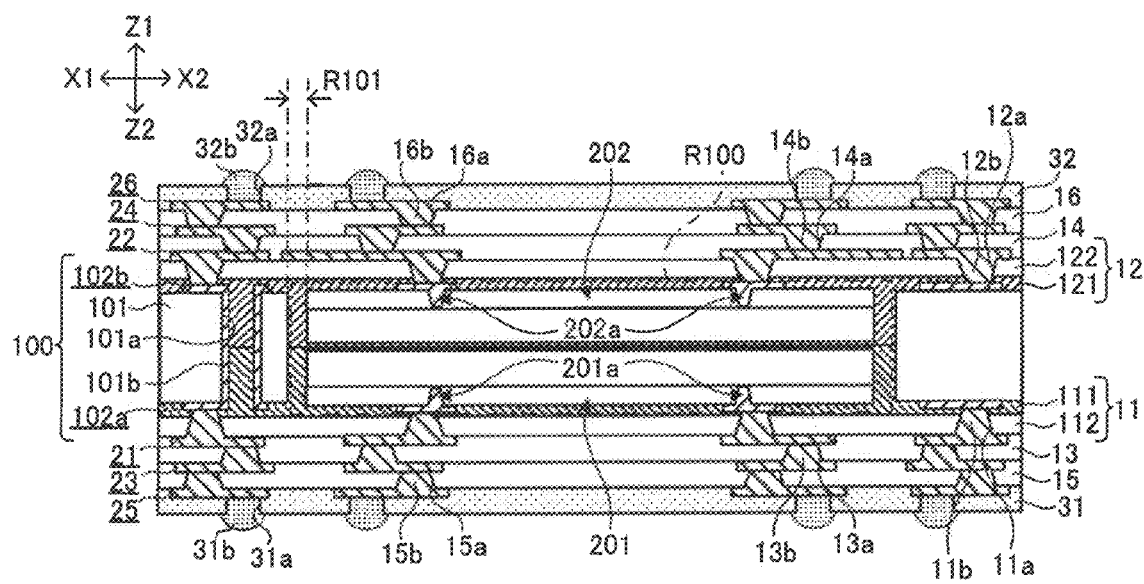
FIG. 15 is a view showing an example of a wiring board with multiple built-in electronic components.

A wiring board may have a built-in electronic component having pads not only on the first surface but also on the second surface. Also, a wiring board may have multiple built-in electronic components. For example, as shown in FIG. 15, a wiring board may have built-in electronic component 201 having pads (201a) on the second-surface side where insulation layer 11 is laminated, and another built-in electronic component 202 having pads (202a) on the first-surface side where insulation layer 12 is laminated. In such a case, it is preferred to form insulation layers 11, 12 with multiple layers respectively, and to coat pads (201a, 202a) of electronic components 201, 202 with the material (insulative material with a low CTE) which forms insulation layers 111, 121.

Electronic component 200 is not limited to any specific type; any type of electronic component, for example, passive components such as a capacitor, resistor or coils, may also be used other than active components such as an IC.

The contents and order of the steps in the above embodiment may be modified within a scope that does not deviate from the gist of the present invention. Also, unnecessary steps may be omitted.

For example, in the above embodiment, the material forming insulation layer 121 is filled in clearance (R101) between electronic component 200 and substrate 101 using a vacuum laminator or a thermal treatment. However, the present invention is not limited to such, and clearance (R101) may be filled using other methods such as pressing. By pressing, the material flows out of insulation layer 121 and fills clearance (R101).

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board comprising:
   a substrate having a first surface and a second surface on an opposite side of the first surface;
   an electronic component provided inside the substrate;
   a first insulation layer formed on the substrate and the electronic component, the first insulation layer comprising a first lower insulation layer and a first upper insulation layer formed directly on the first lower insulating layer, wherein the first lower insulation layer and the first upper insulation layer comprise different materials from each other, the first lower insulation layer is positioned on and in contact with the first surface of the substrate and the electronic component, and the material of the first lower insulation layer is filled in a clearance between the substrate and the electronic component; and
   a first conductive layer formed on a surface of the first upper insulating layer of the first insulation layer, wherein:
   the first conductive layer includes a conductive pattern,
   the electronic component has a connection terminal on a surface of the electronic component which faces a first-surface side of the substrate, and
   the connection terminal of the electronic component and the conductive pattern are electrically connected by a via hole that penetrates each of the first upper and first lower insulating layers of the first insulation layer.

2. The wiring board according to claim 1, wherein the thermal expansion coefficient of the first lower insulation layer is smaller than the thermal expansion coefficient of the first upper insulation layer.

3. The wiring board according to claim 1, wherein a thickness of the first lower insulation layer is smaller than a thickness of the first upper insulation layer.

4. The wiring board according to claim 1, wherein amounts of an additive contained in the first lower insulation layer and the first upper insulation layer are different from each other.

5. The wiring board according to claim 4, wherein the additive is inorganic filler and the amount of the inorganic filler contained in the first lower insulation layer is greater than the amount of the inorganic filler contained in the first upper insulation layer.

6. The wiring board according to claim 1, wherein in the clearance between the substrate and the electronic component, a recess is formed on a surface of a first-surface side of the first lower insulation layer, and the material of the first upper insulation layer fills the recess of the first lower insulation layer.

7. The wiring board according to claim 1, further comprising a second conductive layer formed on a second-surface side of the substrate by a second insulation layer, wherein the second insulation layer comprises a single material and the first upper insulation layer and the second insulation layer comprise a same material.

8. The wiring board according to claim 1, further comprising a second conductive layer formed on a second-surface side of the substrate by a second insulation layer comprising a second lower insulation layer and a second upper insulation layer, wherein the second lower insulation layer and the second upper insulation layer comprise different materials from each other, the second lower insulation layer is positioned on the second surface of the substrate and the electronic component, and the material of the second lower insulation layer and the material of the first lower insulation layer are filled in the clearance between the substrate and the electronic component.

9. The wiring board according to claim 1, wherein the substrate has a through-hole, and the material of the first lower insulation layer is filled in the through-hole.

10. The wiring board according to claim 1, further comprising a second conductive layer formed on a second-surface side of the substrate by a second insulation layer, wherein the second insulation layer is a single layer of a uniform material composition.

* * * * *